(12) United States Patent
Brandt et al.

(10) Patent No.: US 9,954,068 B2
(45) Date of Patent: Apr. 24, 2018

(54) METHOD OF FORMING A TRANSISTOR, METHOD OF PATTERNING A SUBSTRATE, AND TRANSISTOR

(71) Applicant: Infineon Technologies AG, Neubiberg (DE)

(72) Inventors: Philip Christoph Brandt, Oberhaching (DE); Francisco Javier Santos Rodriguez, Villach (AT); Andre Rainer Stegner, Munich (DE)

(73) Assignee: Infineon Technologies AG, Neubiberg, DE (US)

( * ) Notice: Subject to any disclaimer, the term of this patent is extended or adjusted under 35 U.S.C. 154(b) by 5 days.

(21) Appl. No.: 14/866,157

(22) Filed: Sep. 25, 2015

(65) Prior Publication Data

US 2016/0093706 A1 Mar. 31, 2016

(30) Foreign Application Priority Data

Sep. 30, 2014 (DE) .......................... 10 2014 114 235

(51) Int. Cl.
| | |
|---|---|
| *H01L 29/423* | (2006.01) |
| *H01L 21/02* | (2006.01) |
| *H01L 29/78* | (2006.01) |
| *H01L 29/739* | (2006.01) |
| *H01L 21/308* | (2006.01) |
| *H01L 29/66* | (2006.01) |

(52) U.S. Cl.
CPC .... *H01L 29/4236* (2013.01); *H01L 21/02244* (2013.01); *H01L 21/3086* (2013.01); *H01L 29/6656* (2013.01); *H01L 29/66348* (2013.01); *H01L 29/66719* (2013.01); *H01L 29/66727* (2013.01); *H01L 29/66734* (2013.01); *H01L 29/7397* (2013.01); *H01L 29/7813* (2013.01); *H01L 29/42376* (2013.01)

(58) Field of Classification Search
CPC .................................................... H01L 21/3086
See application file for complete search history.

(56) References Cited

U.S. PATENT DOCUMENTS

| | | | |
|---|---|---|---|
| 7,375,029 B2 | 5/2008 | Poelzl | |
| 2011/0298061 A1 | 12/2011 | Siddiqui et al. | |
| 2012/0217513 A1* | 8/2012 | Tega | H01L 29/45 257/77 |
| 2012/0319199 A1* | 12/2012 | Zeng | H01L 29/407 257/334 |
| 2013/0001683 A1* | 1/2013 | Pan | H01L 29/407 257/334 |

(Continued)

*Primary Examiner* — Su C Kim
*Assistant Examiner* — David S Wilbert
(74) *Attorney, Agent, or Firm* — Murphy, Bilak & Homiller, PLLC

(57) ABSTRACT

A method of forming a transistor having a gate electrode includes forming a sacrificial layer over a semiconductor substrate, forming a patterning layer over the sacrificial layer, patterning the patterning layer to form patterned structures, forming spacers adjacent to sidewalls of the patterned structures, removing the patterned structures, etching through the sacrificial layer using the spacers as an etching mask and etching into the semiconductor substrate, thereby forming trenches in the semiconductor substrate, and filling a conductive material in the trenches in the semiconductor substrate to form the gate electrode.

18 Claims, 15 Drawing Sheets

(56) References Cited

U.S. PATENT DOCUMENTS

| | | | |
|---|---|---|---|
| 2013/0049072 A1* | 2/2013 | Heineck | H01L 27/10876 257/202 |
| 2013/0307060 A1* | 11/2013 | Wang | H01L 29/42372 257/330 |
| 2013/0320412 A1* | 12/2013 | Yamasaki | H01L 21/82384 257/288 |
| 2014/0374823 A1* | 12/2014 | Bhalla | H01L 29/7803 257/334 |

* cited by examiner

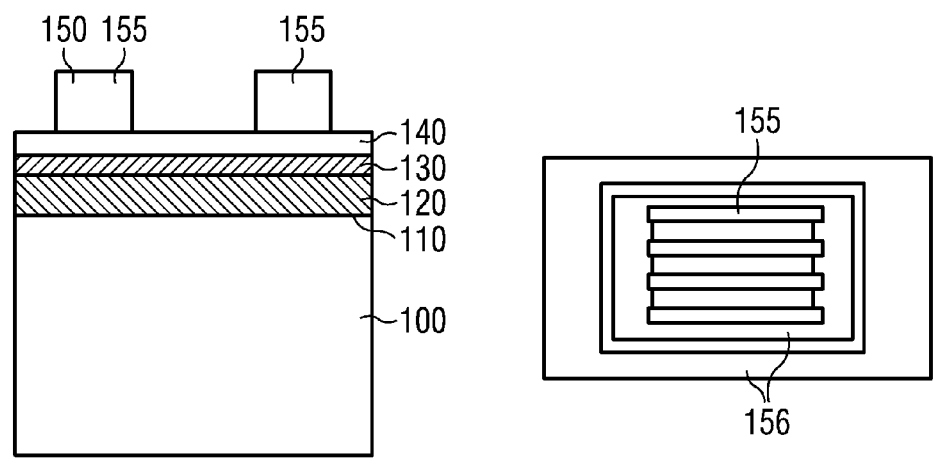
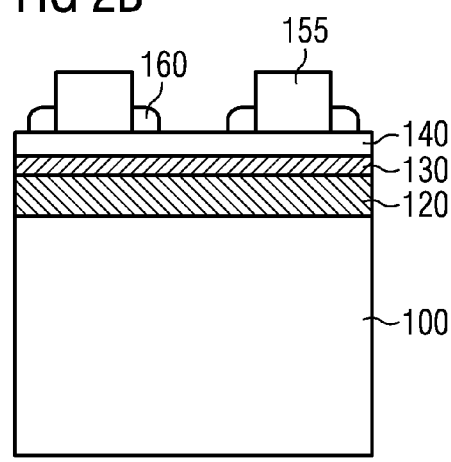
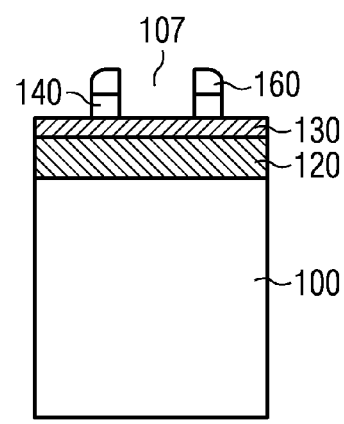
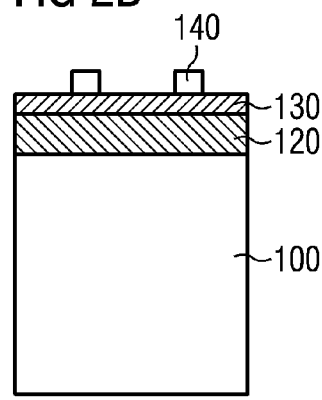
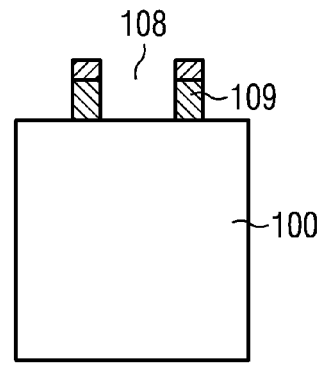

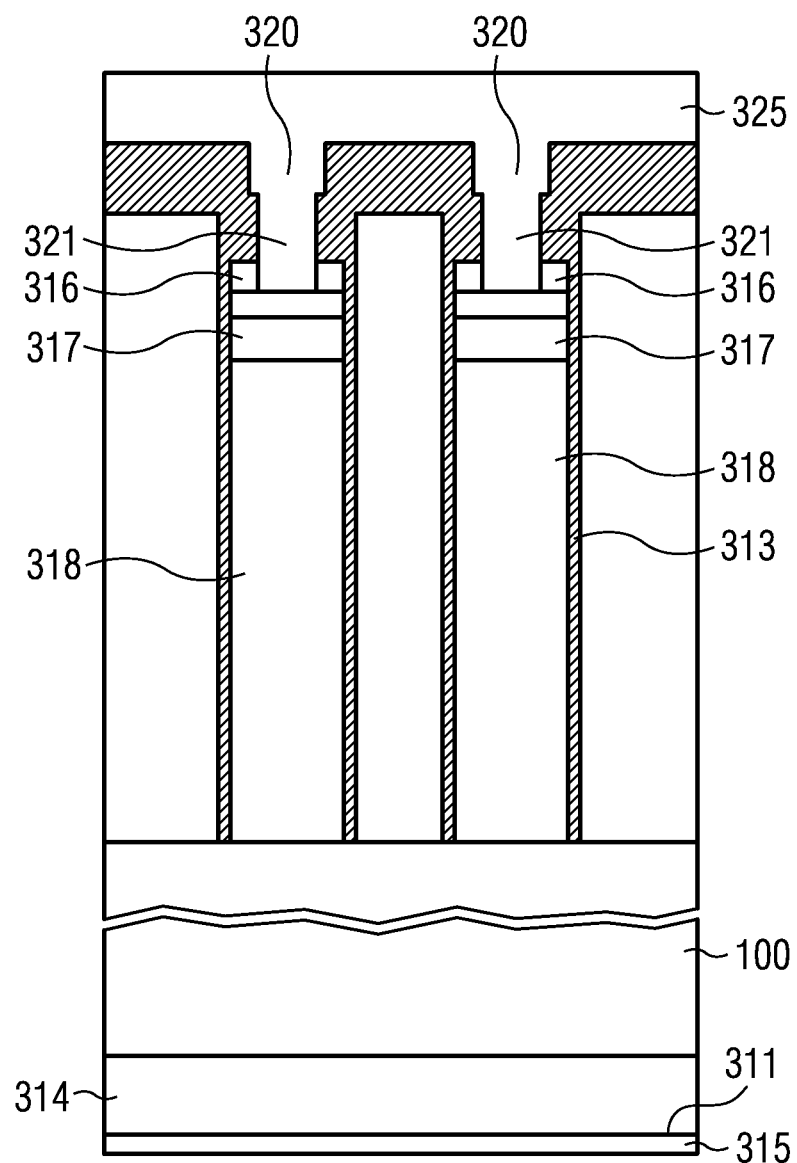

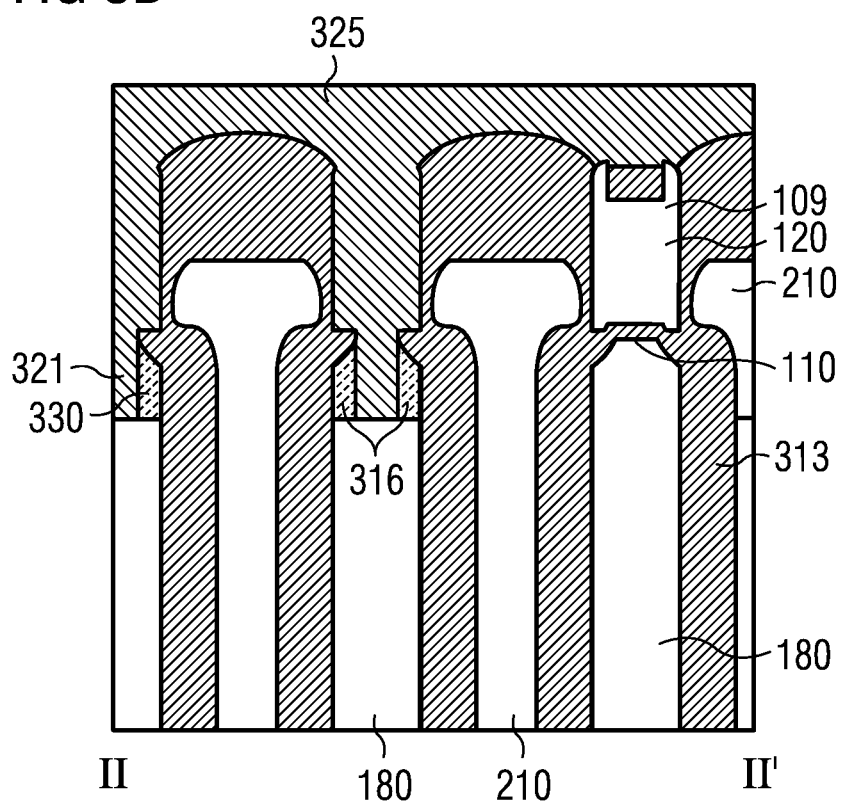

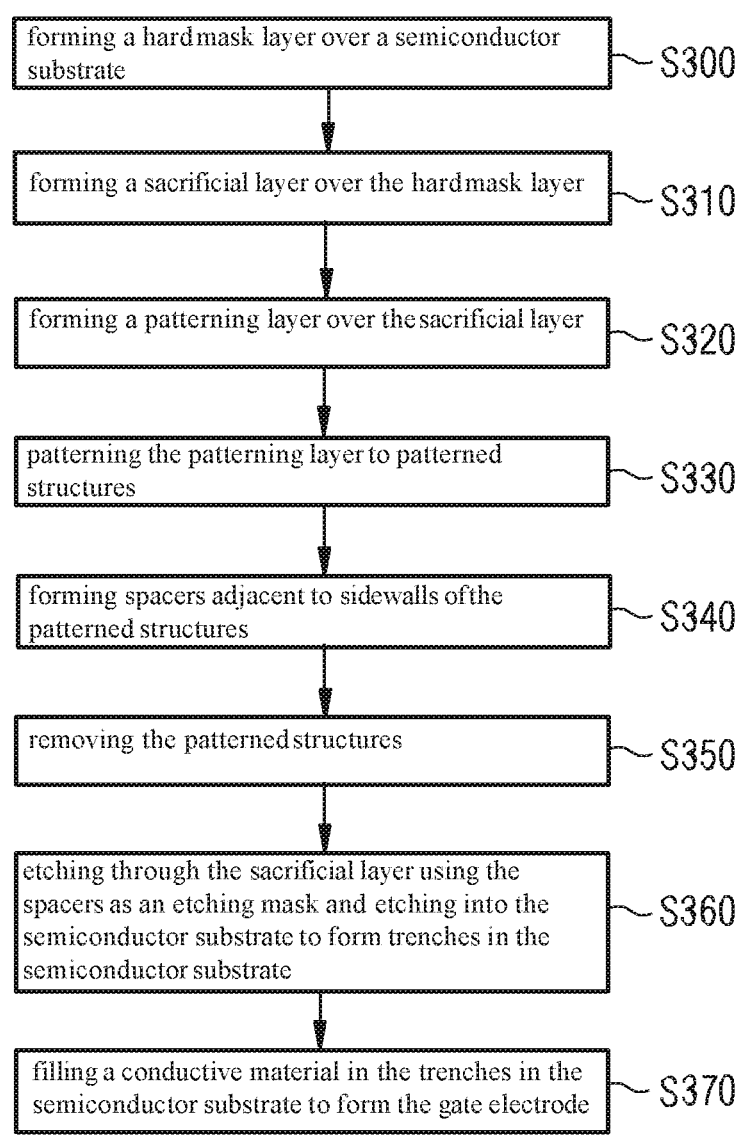

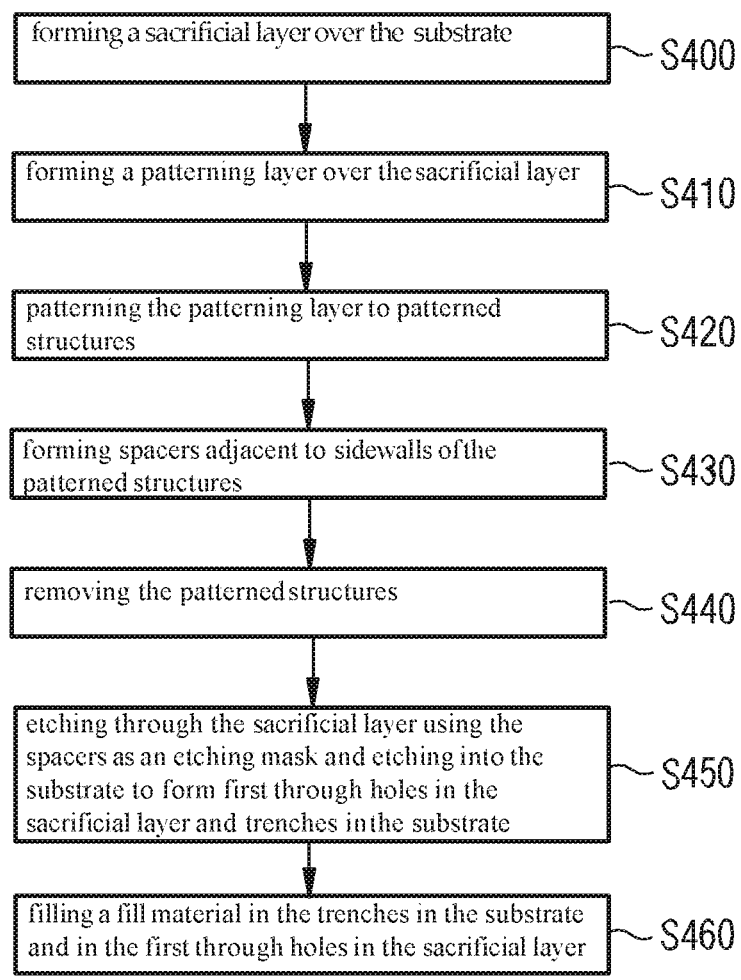

METHOD OF FORMING A TRANSISTOR, METHOD OF PATTERNING A SUBSTRATE, AND TRANSISTOR

PRIORITY CLAIM

This application claims priority to German Patent Application No. 10 2014 114 235.7 filed on 30 Sep. 2014, the content of said application incorporated herein by reference in its entirety.

BACKGROUND

Semiconductor devices, in particular, power semiconductor devices such as field effect transistors (FETs) and insulated gate bipolar transistors (IGBTs) are widely used in a broad field of applications such as, for example automotive and industrial applications. Attempts are being made to increase the performance of semiconductor devices. For example, attempts are being made to increase the performance of IGBTs by reducing the width of body regions or mesas being adjacent gate trenches in an IGBT. Accordingly, it is desirable to provide a method, by which mesa structures may be defined in a homogeneous manner, the mesa structures having a small width.

SUMMARY

According to an embodiment of a method of forming a transistor including a gate electrode, the method comprises: forming a sacrificial layer over a semiconductor substrate; forming a patterning layer over the sacrificial layer; patterning the patterning layer to form patterned structures; forming spacers adjacent to sidewalls of the patterned structures; removing the patterned structures; etching through the sacrificial layer using the spacers as an etching mask and etching into the semiconductor substrate, thereby forming trenches in the semiconductor substrate; and filling a conductive material in the trenches in the semiconductor substrate to form the gate electrode.

According to an embodiment of a method for patterning a substrate, the comprises: forming a sacrificial layer over the substrate; forming a patterning layer over the sacrificial layer; patterning the patterning layer to form patterned structures; forming spacers adjacent to sidewalls of the patterned structures; removing the patterned structures; etching through the sacrificial layer using the spacers as an etching mask and etching into the substrate, thereby forming first through holes in the sacrificial layer and trenches in the substrate; and filling a fill material into the trenches in the substrate and in the first through holes in the sacrificial layer.

According to an embodiment of a transistor, the transistor comprises trenches in a semiconductor substrate, a gate electrode arranged in the trenches and mesas defined between adjacent trenches. The gate electrode comprises a first portion disposed over a main surface of the substrate and a second portion disposed below the main surface. A width of the first portion of the gate electrode is greater than a diameter of the second portion of the gate electrode. A width of the mesas is between 50 to 500 nm.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 2A to 2L illustrate examples of a cross-sectional view of a semiconductor substrate when performing the method according to an embodiment.

FIGS. 3A to 3D illustrate further examples of cross-sectional views of the semiconductor device during processing.

FIG. 3F summarizes a method according to a further embodiment.

FIG. 4F summarizes a method according to a further embodiment.

DETAILED DESCRIPTION

Figure 1A:
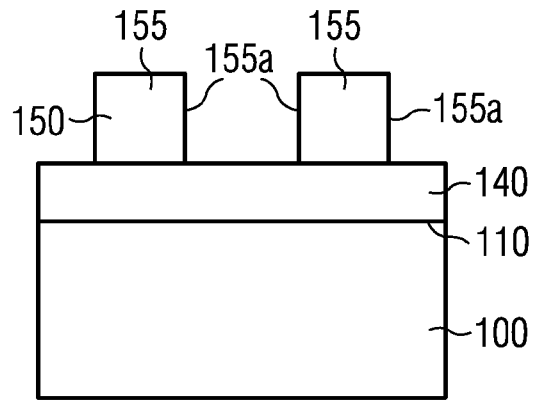
FIGS. 1A to 1F illustrate examples of a cross-sectional view of a semiconductor substrate when performing a method according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be re-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, e.g. whether the current flows in a certain direction or in the opposite direction. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon, carbon or a combination thereof may be provided over the material layer to be patterned. The hardmask layer is photolithographically patterned using an etching process, for example. Taking the patterned hardmask layer as an etching mask, the material layer is patterned.

FIGS. 1A to 1F illustrate a method according to an embodiment. A sacrificial layer 140 is formed over a semiconductor substrate 100. Examples of the sacrificial layer 140 comprise silicon oxide and/or silicon nitride or any other material which may be selectively etched with respect to the semiconductor substrate. A patterning layer 150, for example, a photoresist layer, is formed over a surface of a sacrificial layer 140. The patterning layer 150 is patterned to patterned structures 155. For example, the patterned structures may include lines of a lines/spaces pattern. As is to be clearly understood, the patterned structures 155 need not be linear but may be curved, may form cycles, rectangles and other shapes. According to further embodiments, the patterned structures may be segments of lines or dots or any other pattern according to the needs of the manufacturing process. The patterning layer may of course be a further hard mask material and need not to be restricted to a photoresist layer. The pitch between the patterned structures 155 determines the pitch of the mesas that are to be etched in later processing steps. A distance between adjacent patterned structures 155 may be arbitrary, e.g. 100 nm to 2 μm. According to an embodiment, the distance may be 400 to 800 nm, e.g. 600 nm. A width of the patterned structures 155 may be selected in correspondence with the distance between adjacent patterned structures. According to an embodiment, the width may be 100 nm to 1 μm, more specifically 300 to 600 nm, e.g. 400 nm. FIG. 1A shows an example of a resulting structure.

Figure 1B:
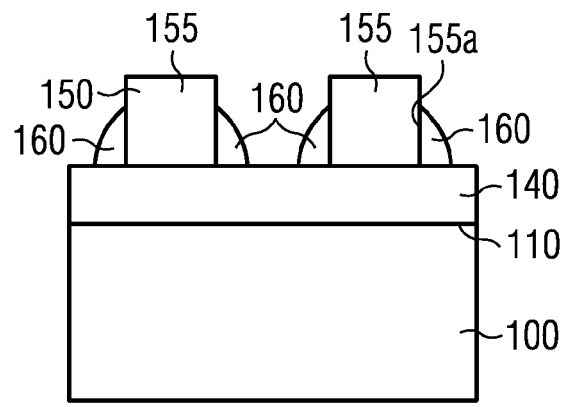
Figure 1C:
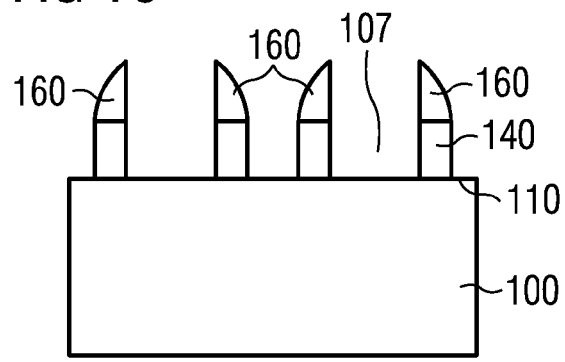

Thereafter, spacers 160 are formed adjacent to sidewalls 155a of the patterned structures 155. For example, this may be accomplished by conformally depositing a spacer material over the surface illustrated in FIG. 1A. For example, the layer of the spacer material may have a thickness of 50 to 300 nm. Thereafter, an anisotropic etching step may be performed which etches the horizontal portions of the spacer material at a higher etching rate than the vertical portions so that spacers are formed. As will be explained later, the width of the mesas formed in the semiconductor substrate 100 depends on the thickness of the spacer material formed during this processing step. FIG. 1B shows an example of a resulting cross-sectional view of the substrate. As is shown, spacers 160 are formed adjacent to sidewalls 155a of the patterned structures 155. Between adjacent spacers 160, a portion of the sacrificial layer 140 is uncovered.

Thereafter, an etching step is performed. For example, the etching step may etch first through holes 107 in the sacrificial layer 140. FIG. 10 shows an example of a cross-sectional view after this processing step.

Figure 1D:
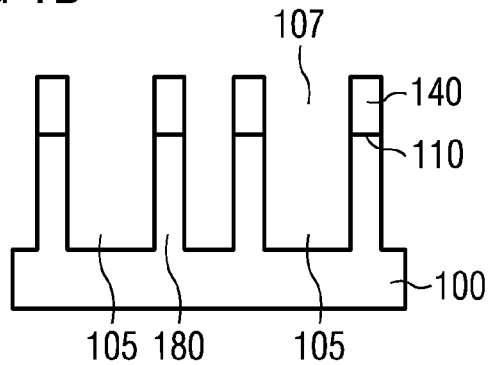

After optionally removing the residues of the spacers 160, etching is continued to etch trenches 105 in the semiconductor substrate 100. FIG. 1D shows an example of a resulting structure. For example, the trenches may be etched to a depth of smaller than 10 μm, e.g. 0.5 to 10 μm, more specifically 1 to 8 μm, e.g. 2 to 6 μm, for example 3 μm. As is further illustrated in FIG. 1D, the width of the remaining substrate material between adjacent trenches 105, i.e. of the mesas, is determined by the width of the spacers 160. The substrate material between adjacent trenches 105 defines the mesa 180 in which the active portions of the transistor may be formed in a later processing step. In the context of the present specification, the term "width" specifically refers to the width measured along the direction of the respective shown cross-sectional views. More specifically, the width of the mesa refers to the width measured perpendicularly to an extension direction of the trenches.

Figure 1E:
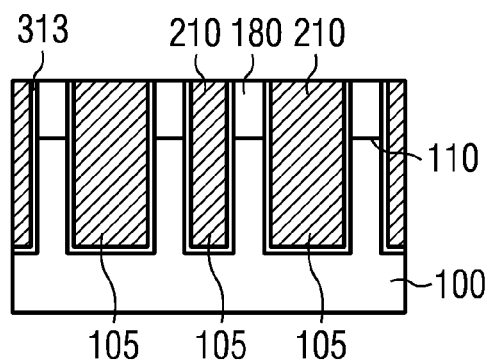

Then, after forming a gate dielectric layer 313 on the sidewalls of the trenches 105, a conductive material 210 is formed in the trenches 105 in the semiconductor substrate 100 to form the gate electrode 310 of the transistor. The gate dielectric material 313 may comprise silicon oxide and/or silicon nitride or any other suitable material for forming the gate dielectric layer. The conductive material 210 may comprise doped polysilicon. FIG. 1E shows a cross-sectional view of a resulting structure. According to the embodiment shown in FIG. 1E, portions of the sacrificial layer 140 are still present over a main surface 110 of the semiconductor substrate 100. Accordingly, the surface of the work piece may be patterned by alternating stripes of conductive material 210 and sacrificial layer material 140.

Figure 1F:
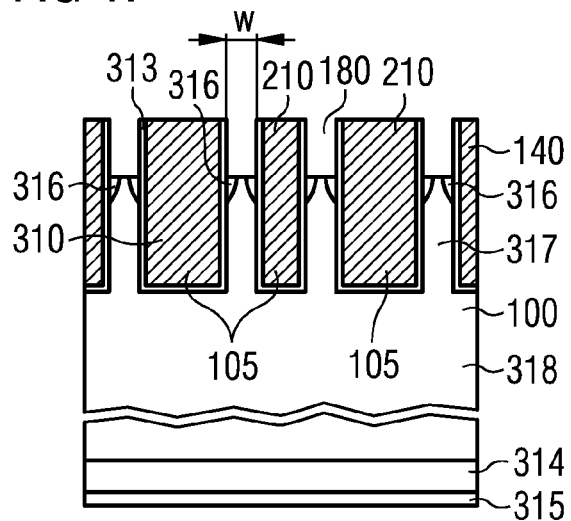

FIG. 1F shows components of a semiconductor device after performing further processing steps. For example, the semiconductor device may further comprise source regions 316 which are disposed adjacent to the main surface 110 of the semiconductor substrate. The semiconductor device may further comprise a body region 317 and a drift zone 318 which is disposed below the trenches 105. According to an embodiment, a width w of the body region may be less than 400 nm, e.g. 50 to 300 nm, more specifically, 100 to 300 nm. The transistor may further comprise a back side region 314 and a back side contact 315. Depending on the doping types of the back side region 314 the transistor may implement an IGBT or a MOSFET. For example, the source region 316 and the drift zone 318 may be of a first conductivity type, and the body region 317 may be of a second conductivity type. According to an embodiment, the back side region 314 may be of the second conductivity type. In this case, the transistor may be an IGBT. When a predetermined voltage Vce is applied between the back side electrode 315 and a source terminal in contact with the source region 316, and a predetermined voltage Vg is applied between the gate electrode 310 and the source terminal, that is, when the gate is turned on, a conductive channel is formed in the body region 317 at a portion adjacent to the gate electrode 310. When the conductive channel is formed, electrons flow from the source region 316 to the drift zone 318. The electrons cause a forward bias between the back side region 314 and the drift zone 318, and holes move from the back side electrode 315 via the back side region 314 into the drift zone 318. This results in a great reduction of resistance of the drift zone 318 due to conductivity modulation, increasing the current capacity of the IGBT. A voltage drop between the back side electrode 315 and the source terminal connected to the source region 316 of the IGBT at this time is referred to as an on-state voltage (Vce(sat)).

When the gate is turned off, i.e. a gate voltage Vge between the gate electrode 310 and the source region 316 is reduced to zero or reverse-biased, no channel region is formed in the body region 317. Accordingly, the flow of electrons from the source region 316 stops. The electrons and holes accumulated in the drift zone 318 either move to the back side region 314 and source region 316, respectively, or recombine.

According to a further embodiment, the back side region 314 may be of the first conductivity type. In this case, the transistor implements a MOSFET. In case of being switched on, i.e. when a corresponding voltage is applied to the gate electrode 310, a conductive inversion layer is formed at the boundary between the body region 317 and the gate dielectric layer 313. Accordingly, the transistor is in a conducting state from the source region 316 to the back side region 314 (drain region) via the drift zone 318. In case of switching-off, no conductive channel is formed at the boundary between the body region 317 and the gate dielectric layer 313.

Figure 1G:
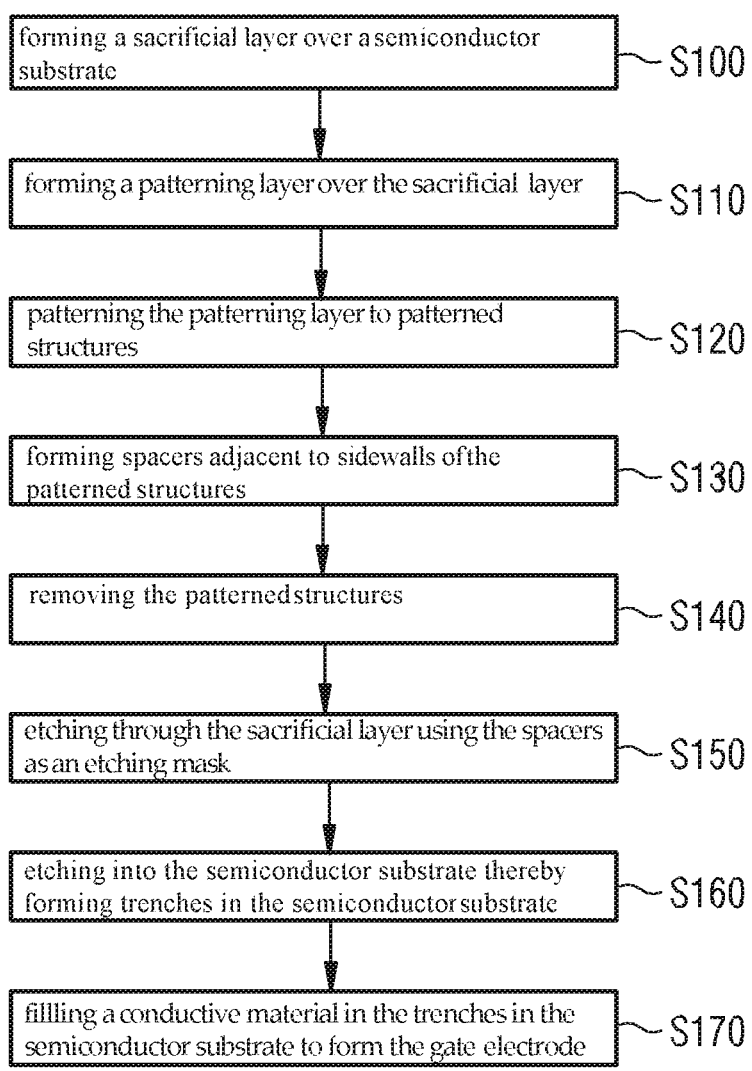
FIG. 1G summarizes a method according to an embodiment.

FIG. 1G summarizes the method according to an embodiment. A method of forming a transistor including a gate electrode comprises forming a sacrificial layer (S100) over a semiconductor substrate, forming a patterning layer (S110) over the sacrificial layer, patterning the patterning layer (S120) to patterned structures, forming spacers (S130) adjacent to sidewalls of the patterned structures, removing the patterned structures (S140), etching through the sacrificial layer (S150) using the spacers as an etching mask and etching into the semiconductor substrate (S160), thereby forming trenches in the semiconductor substrate, and filling (S170) a conductive material in the trenches in the semiconductor substrate to form the gate electrode. As becomes apparent from the foregoing description, the thickness of the spacer layer and, consequently, the width of the spacers, determines the width w of the mesas 180. Since the width of the spacers may be homogenously set over a large area, e.g. the whole wafer surface, the width w of the mesas 180 may be homogenously defined over this area.

FIGS. 2A to 2L illustrate a further method of manufacturing a transistor according to an embodiment. A first hard mask layer 120, which may be made of silicon nitride is formed over a surface 110 of a semiconductor substrate 100. Thereafter, a further hard mask layer 130, which may comprise a silicon oxide layer, is formed over the first hard mask layer. Then a sacrificial layer 140 which is configured to be anisotropically etched and which may be etched selectively with respect to the first and second hard mask layer is formed over the second hard mask layer. For example, the sacrificial layer may comprise polysilicon, amorphous silicon or a ceramic material. Then, a patterning layer 150, such as a photoresist layer is formed over the sacrificial layer 140. The photoresist layer 150 is patterned to form patterned structures 155. The distance between adjacent patterned structures 155 will determine the pitch of the mesas 180 which are formed in the semiconductor substrate 100. For example, a distance between adjacent patterned structures may be 400 to 800 nm, e.g. 600 nm.

FIG. 2A shows an example of a resulting structure. The right-hand portion of FIG. 2A shows a mask that may be used for defining the patterned structures 155. Portions for defining the patterned structures 155 are surrounded by portions 156 of a resist material for defining the active region in which the mesas 180 are to be formed in the semiconductor substrate 100. The width of the mesas 180 is determined by the thickness of a spacer 160 which is subsequently formed by the method as has been explained above. The spacer may have a thickness of 50 to 300 nm. For example, the spacer may be made of silicon nitride. FIG. 2B shows an example of a resulting structure.

Thereafter, the patterned structures 155 are removed and an etching step is performed so as to etch uncovered portions of the sacrificial layer 140, as is also illustrated in FIG. 2C. For example, the spacers 160 serve as an etching mask. First through holes 107 are formed in the sacrificial layer 140 by this etching method. FIG. 2D shows a cross-sectional view of a resulting structure after removing the residues of the spacers 160.

Thereafter, a further etching step is performed using the patterned sacrificial layer 140 as an etching mask. As a result, second through holes 108 are defined in the layer stack comprising the first and second hard mask layers 120, 130. Thereby, a hard mask pattern 109 is formed of the first and second hard mask layers, as is also illustrated in FIG. 2E.

Figure 2F:
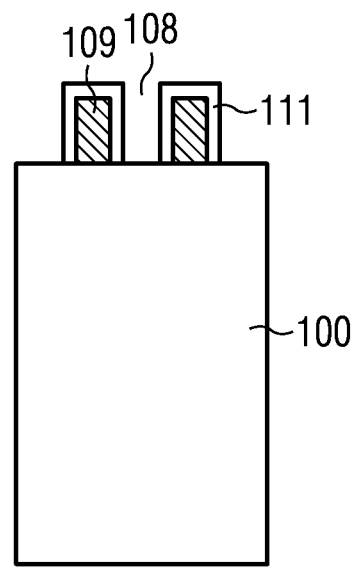

According to an embodiment, thereafter, a cover layer 111, e.g. of silicon oxide, may be formed to cover the hard mask pattern 109. For example, the cover layer 111 may be isotropically deposited or thermally grown and may be etched anisotropically so as to remove horizontal portions of this layer from the substrate material. As a result, the structures 109 are covered by silicon oxide material. The thickness of the cover layer 111 in combination with the distance of the structures 109 determines the width of the trenches which are to be formed in the next processing steps. FIG. 2F shows an example of a resulting structure.

Figure 2G:
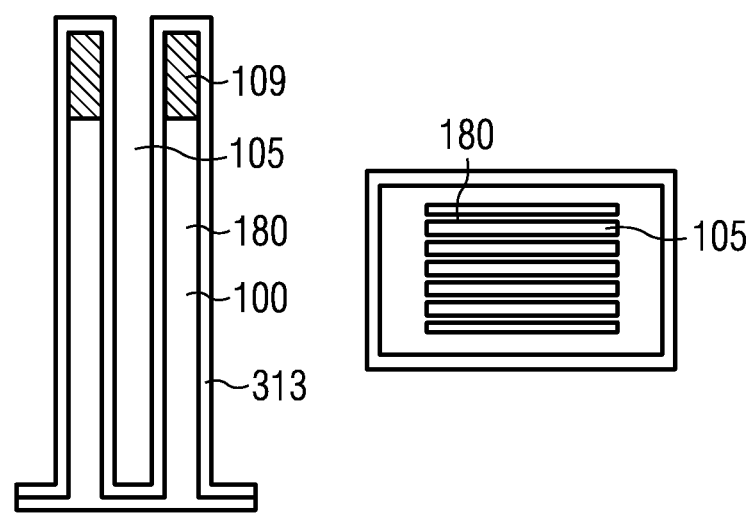

FIG. 2G shows an example of a structure after etching trenches 105 in the semiconductor substrate using the structures 109 covered by the silicon oxide layer 111 as an etching mask. For example, the trenches may have a depth of approximately 1 to 8 μm, e.g. 2 to 6 m, for example 3 μm. Further, a dielectric layer may be formed on sidewalls of the trenches 105 to form the gate dielectric layer 313 of the resulting transistor. As is further illustrated in FIG. 2G, mesas 180 of the remaining semiconductor material 100 are formed between adjacent trenches 105. For example, the gate dielectric layer 313 may be formed by thermal oxidation of the sidewalls of the mesas 180. The right-hand portion of FIG. 2G illustrates a schematic plan view of the resulting structure. As can be seen, the distance between adjacent trenches 105, and, consequently of the mesas 180 is much smaller than the width of structures shown in the right-hand portion of FIG. 2A.

Thereafter, a conductive material 210 such as polysilicon may be filled into the trenches 105. The conductive material is filled to approximately a height of the structures 109.

A process of modifying a surface of the conductive material 210 is performed to form modified surface portions 215. For example, in case the conductive material is polysilicon, a thermal process may be performed to form silicon oxide.

Figure 2H:
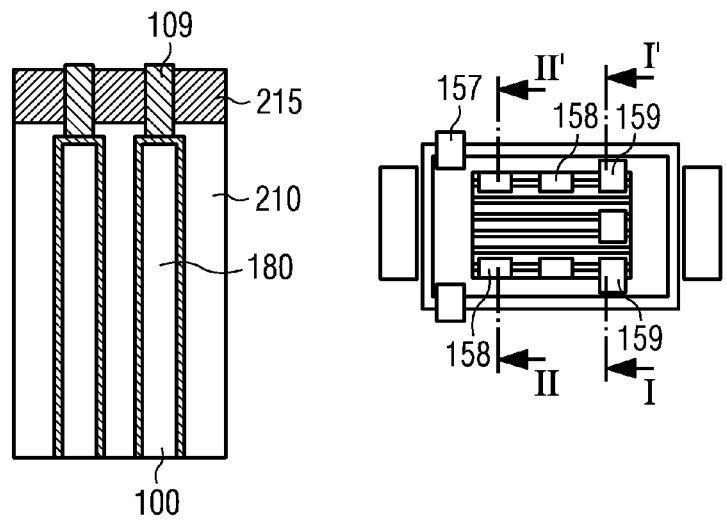

FIG. 2H shows an example of a resulting structure. As is further illustrated in FIG. 2H, as a consequence of the processing sequence in which the patterning layer 140 is patterned to form structures 109, and further, a conductive material 210 is filled in the trenches, followed by modifying a surface portion of the conductive layer, a surface region of the resulting structure comprises a hard mask pattern of structures 109 of silicon nitride and further adjacent portions of the modified conductive layer 215 which may be silicon oxide. The arrangement of these hard mask portions is such that the structures 109 of silicon nitride are disposed over the mesas 180, whereas the silicon oxide is disposed over the conductive material 210. The right-hand portion of FIG. 2H illustrates a mask that may be used for defining contact portions to the gate electrodes 310 and the mesas 180. In particular, the mask has openings 157, 158, 159 which are much larger than the contacts to be defined. Due to the presence of two different materials, i.e. silicon oxide 215 and silicon nitride 109 adjacent to the surface, the contacts may be opened in a self-aligned manner to the underlying materials. Accordingly, even though the openings 157, 158, 159 have a larger width than the contacts to be formed, the contacts may be formed in a precise manner since the two materials may be etched selectively to each other.

In the next step, the structures 109 of silicon nitride may be removed from the surface of the mesas. Thereafter, doping processes may be performed, for example, by ion implantation. Thereby, a first doped region 311 and a second doped region 312 may be defined.

Figure 2I:
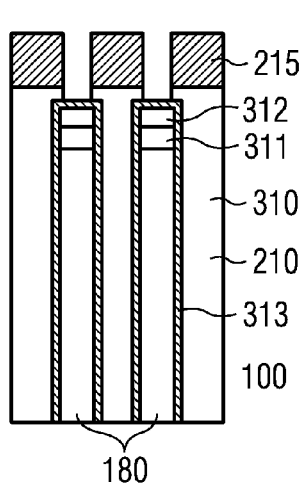
Figure 2J:
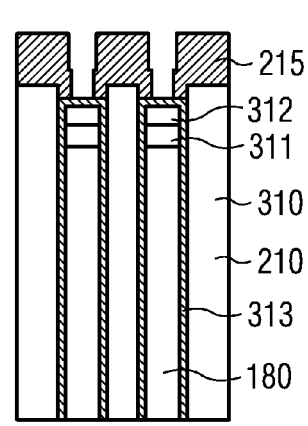
Figure 2K:
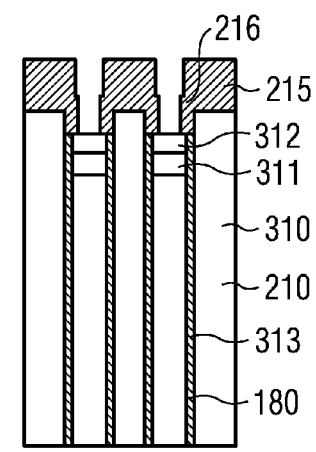

FIG. 2I shows an example of a resulting structure. The first doped region 311 and the second doped region 312 are disposed in an upper portion of the mesa 180. The second doped region 312 is adjacent to an upper surface of the mesa 180. Further, optionally, silicon oxide layers may be formed so as to cover portions of the mesas 180 and the sidewalls of the conductive material 210 (FIG. 2J). Then, for example, horizontal portions of a formed silicon oxide layer may be removed so as to form a contact hole and spacers 216 covering the sidewalls of the conductive material 210 (FIG. 2K). Thereafter, a metallization layer 325 may be formed in the contact holes 320 to form mesa contacts 321. Thereby, an electrical contact between adjacent mesas 180 may be accomplished. The mesa contacts 321 intersect the second doped region 312 that forms a source region 316 of the resulting transistor. The mesa contacts 321 contact the body region 317 that is formed in the first doped region 311.

FIG. 2L shows an example of a resulting structure. As is further illustrated in FIG. 2L, the semiconductor device comprises a back side contact layer 314 and a back side metallization 315 to implement the transistor.

Figure 3A:
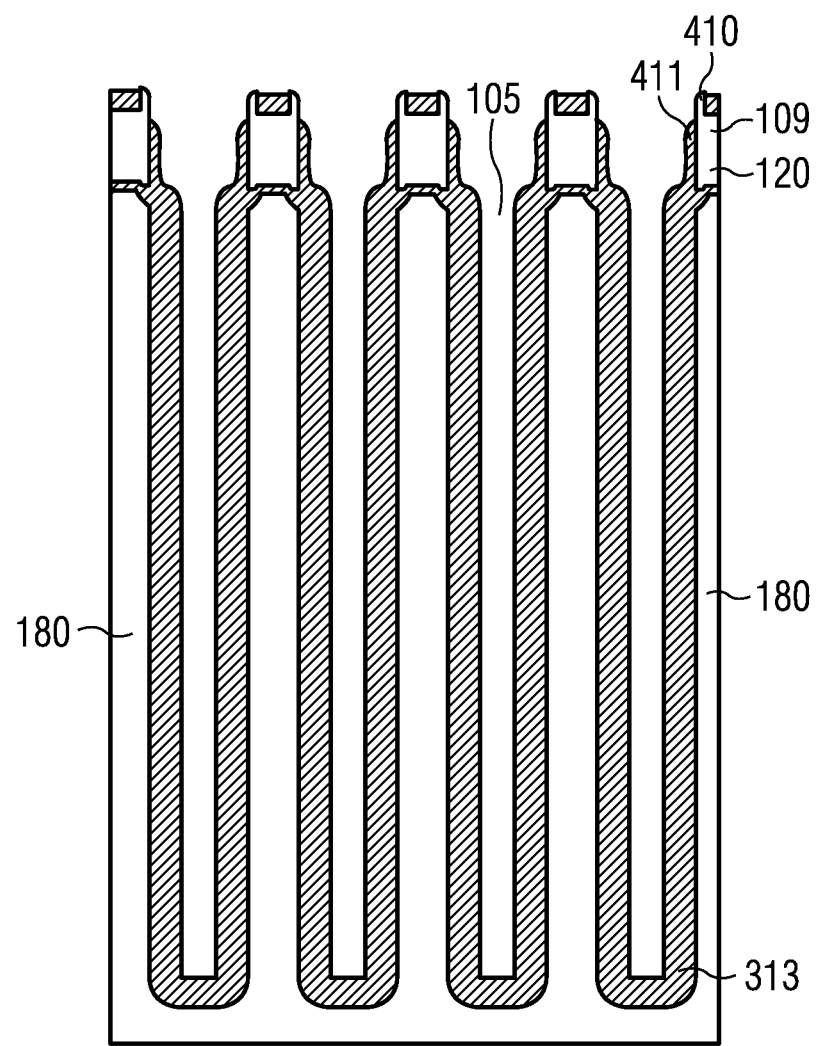

FIG. 3A to 3E illustrate further details or modifications of the structures discussed herein above. FIG. 3A shows an example of a semiconductor substrate after forming trenches 105 and forming a dielectric layer 313 on sidewalls of the mesas 180 formed in the semiconductor substrate. Starting from the structure illustrated in FIG. 2E, according to a further modification, silicon nitride spacers 410 may be formed adjacent to the structures 109. For example, this may be accomplished by depositing a conformal thin silicon nitride layer and anisotropically etching the silicon nitride so as to remove horizontal portions thereof. As a consequence, the silicon nitride spacer 410 is formed adjacent to the structures 109. Due to this silicon nitride spacer, an under etching of the silicon nitride spacer may be prevented. Then, a further silicon oxide spacer may be formed. The silicon oxide spacer 411 may serve as an etching mask when etching the trenches 105 in the semiconductor substrate 100. Thereafter, a dielectric layer 313, such as silicon oxide may be formed, e.g. by thermal oxidation to form the gate oxide layer 313. FIG. 3A shows an example of a resulting structure.

Thereafter, a conductive material is filled in the trenches 105. Due to the fact that the gate oxide layer 313 is thermally grown on substrate material 100, the gate dielectric layer 313 is only present in a lower portion of the trenches 105. As a result, the conductive material 210 has a larger width $t_1$ in a surface portion thereof than in a lower region thereof.

Figure 3B:
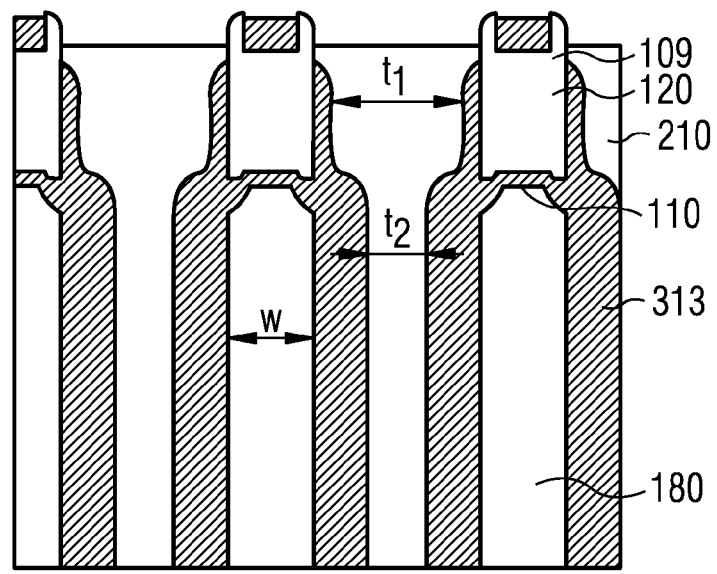

FIG. 3B shows an example of a resulting structure. As is shown, the width $t_1$ is larger than the width $t_2$ in a lower trench portion. A width w of the mesas 180 is in a range from 30 to 500 nm, e.g. 30 to 300 nm. The conductive filling 210 is filled to approximately a height of the structures 109. Thereafter, an upper portion of the conductive filling 210 is removed, followed by a thermal process so as to form the modified surface region 215.

Figure 3C:
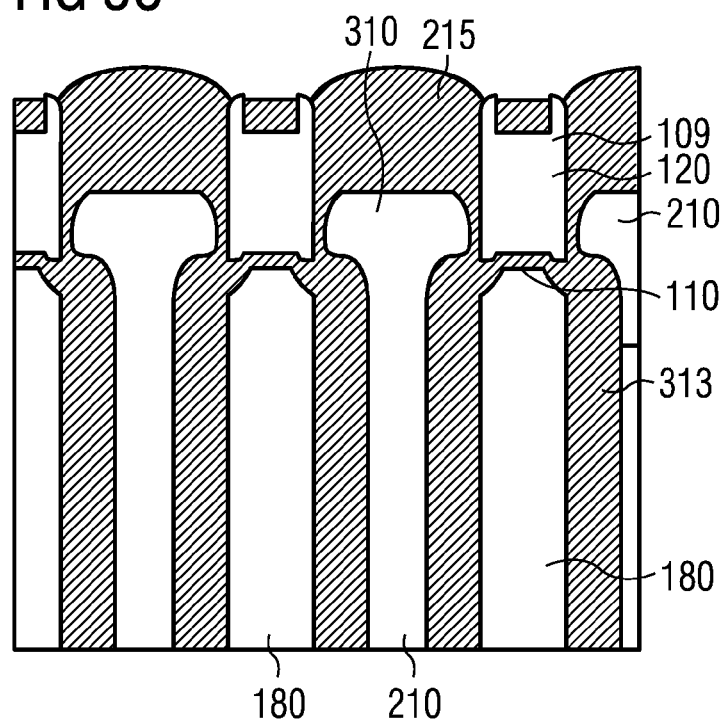

FIG. 3C shows an example of a resulting structure. As is shown, a silicon oxide layer is formed over the conductive filling 210. For forming the contacts to the mesa region 180, contact holes may be formed using the mask illustrated in the right-hand portion of FIG. 2H, for example, the mask including openings 158. After photolithographically defining the contact openings, silicon nitride is etched selectively with respect to silicon oxide so as to remove the structures 109. Then, further implantations steps may be performed so as to form the doped region 330. Contact holes extending in the mesa material 180 are formed. Further, a metallization layer 325 is formed. As a result, mesa contacts 321 are formed that are electrically connected by the metallization layer 325.

FIG. 3D shows an example of a resulting structure between II and II' as is also indicated in the right hand portion of FIG. 2H. The cross-sectional view intersects the mesa contacts 321. Doped regions that may form the source regions 316 are disposed on either sidewalls of the gate electrodes 310 and may be connected to a source terminal via a mesa contact 321. In a similar manner, contacts to the gate electrode 310 may be formed. To be more specific, starting from the structure shown in FIG. 3C, openings are formed in the silicon oxide layer 215 to form gate contacts 311. For forming the gate contacts 311, e.g. the mask illustrated in the right-hand portion of FIG. 2H including gate contact openings 159 may be used.

Figure 3E:
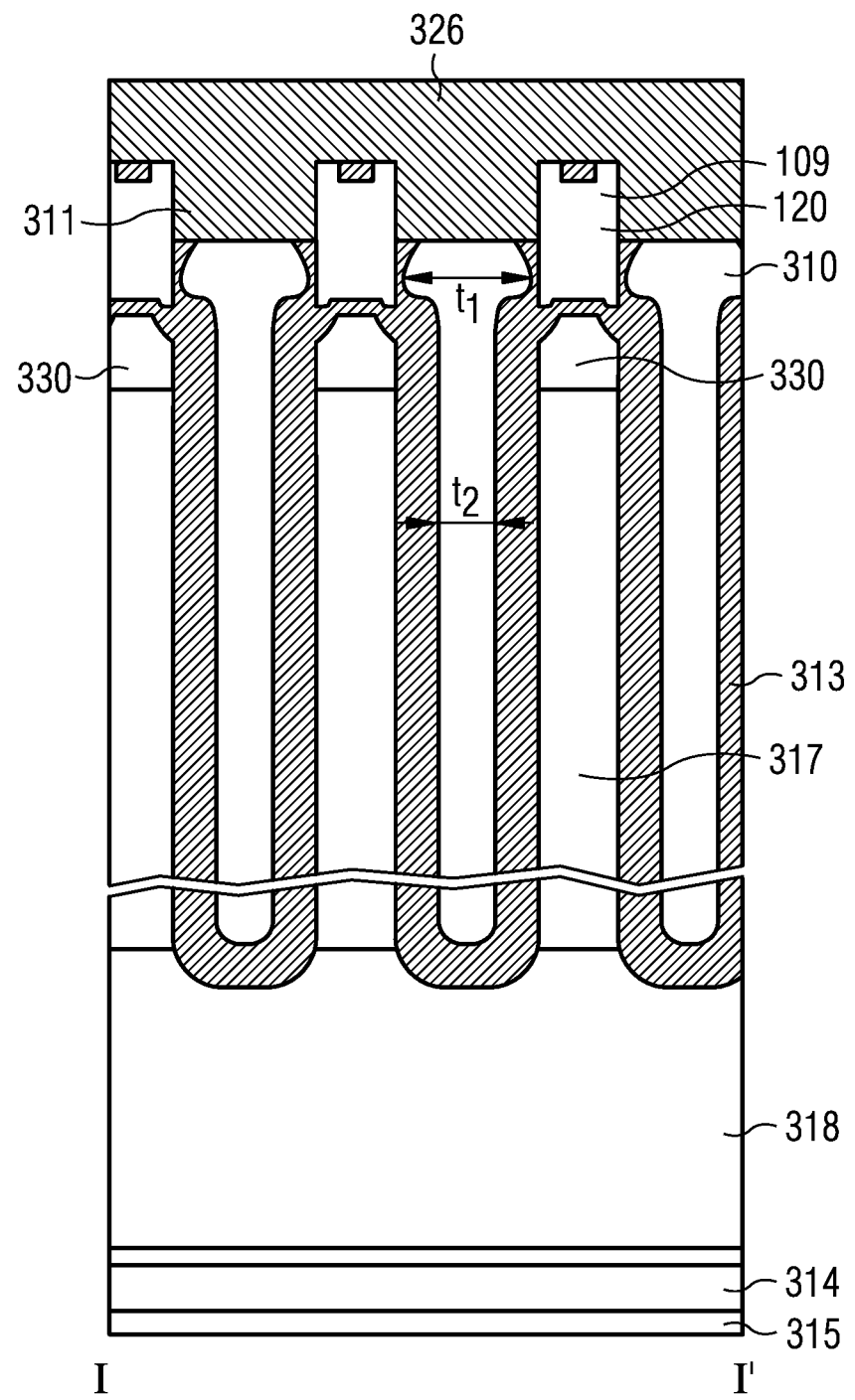
FIG. 3E illustrates a cross-sectional view of a semiconductor device according to an embodiment.

FIG. 3E shows a cross-sectional view of an example of a resulting transistor between I and I' as is also illustrated in the right-hand portion of FIG. 2H. The cross-sectional view of FIG. 3E intersects the gate contacts 311. A portion of the gate electrode 310 is disposed below the substrate surface 110, and a portion of the gate electrode 310 is disposed above the substrate surface 110. A gate contact 311 contacts the gate electrode 310. For example, a plurality of gate electrodes 310 being disposed in different trenches 105 may be connected via gate contacts 311 with a conductive element 326, e.g. a metallization layer. As a result, the gate electrodes 310 may be connected with a common terminal.

The width t1 of the gate electrode in an upper portion above the substrate surface 110 is larger than the width t2 of the gate electrode in a lower portion below the substrate surface 110. A body region 317 is disposed below the source regions 316. A back side contact 315 is formed in contact with the back side region 314. The drift zone 318 may be disposed between the body region 317 and the backside region 314. The doping types of the doped regions and the functionality of the transistors may be as specified above with respect to FIG. 1F. Due to implementing the mesas 180 to have a width w of less than 350 nm, e.g. less than 300 nm, the performance of an IGBT may be improved. Further, the density of channels may be increased.

FIG. 3F summarizes a method of forming a transistor including a gate electrode according to an embodiment. The method comprises forming (S300) a hard mask layer over a semiconductor substrate, forming (S310) a sacrificial layer over the hard mask layer, the sacrificial layer being selectively etchable with respect to the sacrificial layer, forming (S320) a patterning layer over the sacrificial layer, patterning (S330) the patterning layer to patterned structures, forming spacers (S340) adjacent to sidewalls of the patterned structures, removing (S350) the patterned structures, etching (S360) through the sacrificial layer using the spacers as an etching mask and etching into the semiconductor substrate, thereby forming trenches in the semiconductor substrate, filling (S370) a conductive material in the trenches in the semiconductor substrate to form the gate electrode.

As has been described in the foregoing, the method may be used for patterning a substrate in such a manner so that a work piece having an approximately planar surface is formed. The substrate is patterned to form trenches and mesas between adjacent trenches. Further, different materials are present above the trenches and the mesas so that the surface has a pattern corresponding to the underlying pattern of different materials. Further, since the thickness of the spacer layer determines the width of the mesas, mesas having a reduced width may be homogenously formed over a certain area.

Figure 4A:
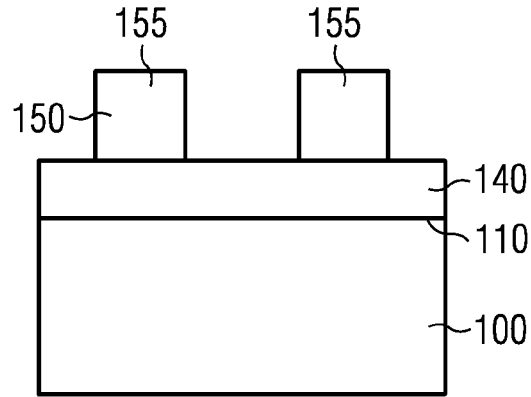
FIGS. 4A to 4E show examples of a cross-sectional view of a semiconductor substrate when performing the method according to a further embodiment.
Figure 4B:
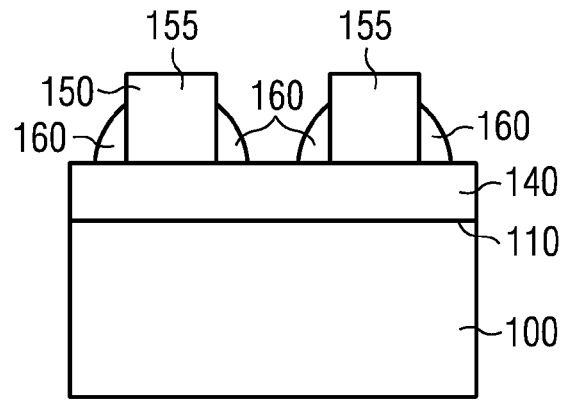

FIGS. 4A to 4E illustrate an embodiment of a general method for patterning a substrate. The method comprises forming a sacrificial layer 140 over the substrate 100. The sacrificial layer 140 may be implemented as has been described above. The method further comprises forming a patterning layer 150, which may e.g. be a photoresist layer, over the sacrificial layer 140. The patterning layer 150 is patterned to patterned structures 155. FIG. 4A shows a cross-sectional view of an example of a resulting structure. Thereafter, spacers 160 adjacent to sidewalls of the patterned structures are formed in the manner as has been explained above (FIG. 4B). Then, the patterned structures 155 are removed. An etching process is performed which etches through the sacrificial layer using the spacers 160 as an etching mask and into the substrate, thereby forming first through holes 107 in the sacrificial layer 140.

Figure 4C:
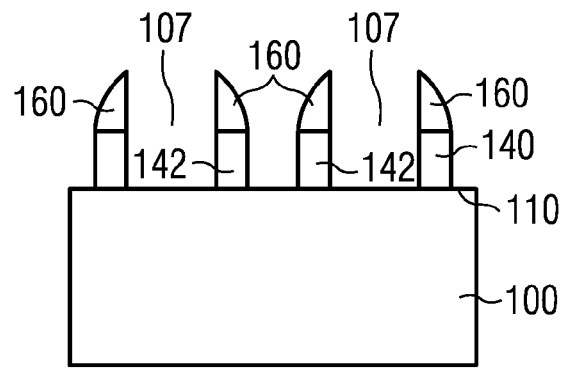
Figure 4D:
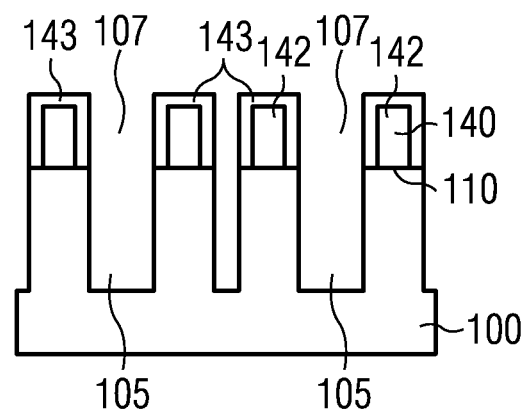

FIG. 4C shows an example of a resulting structure. As is shown, patterned portions 142 of the sacrificial layer 140 are formed. Further, a cover layer 143 may be formed adjacent to sidewalls of the portions 142 of the sacrificial layer 140. Thereby, the width of the trenches 105 may be further reduced. Thereafter, trenches 105 are etched in the substrate. FIG. 4D shows an example of a resulting structure, in which the cover layer 143 has been formed. Thereafter, a fill material 210 is filled into the trenches 105 in the substrate and in the first through holes 107 in the sacrificial layer 140.

Figure 4E:
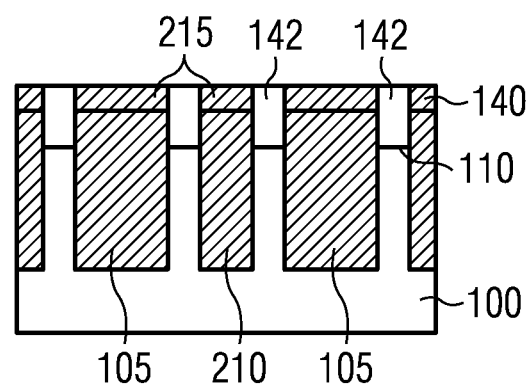

FIG. 4E shows an example of a resulting structure. According to a further embodiment, the method may further comprise modifying a surface portion of the fill material to form modified surface portions 215. As a result of these processing steps, the work piece includes trenches 105 filled with the fill material 210 and remaining substrate portions disposed between the trenches 105. Portions of the sacrificial layer 140 are disposed over the substrate portions 100, whereas modified surface portions 215 are disposed above portions of the fill material 210. Accordingly, there is a work piece having alternating modified surface portions 215 and portions of the sacrificial layer 140 which may be etched selectively to each other. As a result, it becomes possible to form openings in a self-aligned manner.

FIG. 4F summarizes the method according to this embodiment. As is illustrated, a method for patterning a substrate comprises forming (S400) a sacrificial layer over the substrate, forming (S410) a patterning layer over the sacrificial layer, patterning (S420) the patterning layer to patterned structures, forming (S430) spacers adjacent to sidewalls of the patterned structures, removing (S440) the patterned structures, etching (S450) through the sacrificial layer using the spacers as an etching mask and etching into the substrate, thereby forming first through holes in the sacrificial layer and trenches in the substrate, and filling (S460) a fill material in the trenches in the substrate and in the first through holes in the sacrificial layer.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein. Instead, the present invention is limited only by the following claims and their legal equivalents.

What is claimed is:

1. A method of forming a transistor including a gate electrode, the method comprising:
    forming a sacrificial layer over a semiconductor substrate;
    forming a patterning layer over the sacrificial layer;
    patterning the patterning layer to form patterned structures;
    forming spacers adjacent to sidewalls of the patterned structures;
    removing the patterned structures;
    etching through the sacrificial layer using the spacers as an etching mask and etching into the semiconductor substrate, thereby forming trenches in the semiconductor substrate, wherein semiconductor mesas are defined by adjacent ones of the trenches;
    filling a conductive material in the trenches in the semiconductor substrate to form gate electrodes;
    forming a body region of a second conductivity type in the semiconductor mesas, a source region of a first conductivity type in the body region and a drift zone of the first conductivity type below the body region such that the conductive material extends above an upper surface of the source region;
    selectively removing the etching mask to define a first opening over the semiconductor substrate to form a gate contact to a gate electrode, the first opening having a greater width than a width of the trench; and
    selectively removing the etching mask to define a second opening over the semiconductor substrate to form a mesa contact to a semiconductor mesa such that at least one of two adjacent semiconductor mesas is not in contact with the mesa contact, the second opening having a greater width than a distance between adjacent trenches, a width of a bottom portion of mesa contact contacting the semiconductor mesa being less than a width of the semiconductor mesa.

2. The method of claim 1, wherein etching through the sacrificial layer and etching into the substrate also forms first through holes in the sacrificial layer, and wherein the conductive material also fills the first through holes in the sacrificial layer.

3. The method of claim 1, further comprising forming a hard mask layer over the semiconductor substrate before forming the sacrificial layer, the sacrificial layer being selectively etchable with respect to the hard mask layer.

4. The method of claim 3, further comprising etching through the hard mask layer using the patterned sacrificial layer as an etching mask to form second through holes in the hard mask layer and to form patterned hardmask portions, and wherein the conductive material also fills the second through holes in the hard mask layer.

5. The method of claim 4, further comprising covering an edge portion of the semiconductor substrate with portions of a resist material before etching so that the spacers and the portions of the resist material act as the etching mask.

6. The method of claim 2, further comprising modifying a surface portion of the conductive material to form modified surface portions.

7. The method of claim 4, further comprising covering sidewalls of the patterned hardmask with a cover layer.

8. The method of claim 6, wherein modifying the surface portion of the conductive material comprises oxidizing the surface of the conductive material.

9. The method of claim 1, further comprising forming a dielectric layer on a sidewall of the trench in the semiconductor substrate before filling the conductive material in the trenches.

10. The method of claim 1, further comprising forming additional mesa contacts to the semiconductor mesas and forming a conductive element electrically coupling the mesa contacts to each other.

11. The method of claim 1, further comprising forming additional gate contacts to the gate electrodes and forming a conductive element electrically coupling the gate contacts to each other.

12. A method for patterning a substrate, the method comprising:
    forming a sacrificial layer over the substrate;
    forming a patterning layer over the sacrificial layer;
    patterning the patterning layer to form patterned structures;
    forming spacers adjacent to sidewalls of the patterned structures;
    removing the patterned structures;
    etching through the sacrificial layer using the spacers as an etching mask and etching into the substrate, thereby forming first through holes in the sacrificial layer and trenches in the substrate, wherein semiconductor mesas are defined by adjacent ones of the trenches;
    filling a fill material into the trenches in the substrate and in the first through holes in the sacrificial layer;
    forming a body region of a second conductivity type in the semiconductor mesas, a source region of a first conductivity type in the body region and a drift zone of the first conductivity type below the body region such that the fill material extends above an upper surface of the source region,
    selectively removing the etching mask to define a first opening over the substrate to form a gate contact to a gate electrode, the first opening having a greater width than a width of the trench; and
    selectively removing the etching mask to define a second opening over the substrate to form a mesa contact to a semiconductor mesa such that at least one of two adjacent semiconductor mesas is not in contact with the mesa contact, the second opening having a greater width than a distance between adjacent trenches, a width of a bottom portion of mesa contact contacting the semiconductor mesa being less than a width of the semiconductor mesa.

13. The method of claim 12, further comprising modifying a surface of the fill material to form modified surface portions.

14. The method of claim 13, wherein modifying the surface of the fill material comprises oxidizing the surface of the fill material.

15. The method of claim 12, wherein forming the trenches in the substrate and the first through holes in the sacrificial layer comprises:
    etching the sacrificial layer using the spacers as an etching mask to form the first through holes and sacrificial structures in the sacrificial layer;
    removing the spacers; and
    etching the trenches into the substrate using the sacrificial structures as an etching mask.

16. The method of claim 15, further comprising forming a cover layer on sidewalls of the sacrificial structures before etching the trenches into the substrate.

17. The method of claim 1, wherein the drift zone is disposed in the semiconductor mesas.

18. The method of claim 1, wherein the drift zone is disposed below the semiconductor mesas in the semiconductor substrate.

* * * * *